(12) United States Patent
Kasamizugami

(10) Patent No.: US 6,219,756 B1
(45) Date of Patent: Apr. 17, 2001

(54) RAPIDLY-READABLE REGISTER FILE

(75) Inventor: Masayoshi Kasamizugami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/132,314

(22) Filed: Aug. 11, 1998

(30) Foreign Application Priority Data

Dec. 24, 1997 (JP) .................................................... 9-354795

(51) Int. Cl.[7] .............................. G06F 12/08; G06F 9/26; G11C 7/00
(52) U.S. Cl. ........................ 711/127; 712/22; 365/189.02
(58) Field of Search ........................ 365/230.05, 189.02; 711/127; 327/57; 307/38; 712/300, 22, 218

(56) References Cited

U.S. PATENT DOCUMENTS

| | | | |
|---|---|---|---|
| 5,222,240 | * 6/1993 | Patel | 712/218 |
| 5,481,495 | * 1/1996 | Henkels et al. | 365/189.02 |
| 5,502,683 | * 3/1996 | Marchioro | 365/230.05 |
| 5,724,299 | * 3/1998 | Podlesny et al. | 365/230.05 |
| 5,929,660 | * 7/1999 | Dillinger | 327/57 |
| 5,978,887 | * 11/1999 | Yeager | 711/127 |

* cited by examiner

*Primary Examiner*—Daniel H. Pan
*Assistant Examiner*—Te Yu Chen
(74) *Attorney, Agent, or Firm*—Staas & Halsey LLP (57) ABSTRACT

The present invention discloses a register file in which a read access time is reduced, a data bus width is made expandable, more rapid decoding can be given at a time of data readout, and the whole logic unit is made higher in performance. For these purposes, in the register file of the invention, register arrays are classified into a plurality of banks, and a sense amplifier is provided for each of the banks. Further, the register file includes a decoder to select a word corresponding to a result of decoding of partial bits of a read address so as to read the word from the register array in each of the banks, a decoder to specify a bank corresponding to a result of decoding of remaining bits of the read address, and a multiplexer to select the word from the bank specified by the decoder so as to output the word to the read port. The present invention can be applied to a storage portion mounted in a processing unit such as microprocessor or CPU to contain intermediate results of a calculation, constants, and so forth.

10 Claims, 8 Drawing Sheets

RAPIDLY-READABLE REGISTER FILE

BACKGROUND OF THE INVENTION

1) Field of the Invention

The present invention relates to a register file mounted in a processor such as microprocessor or CPU, and including a plurality of register arrays used for storing intermediate results of a calculation, constants, and so forth. In particular, the present invention relates to a register file having a multiport configuration in which a plurality of read ports and a plurality of write ports are mounted, and a plurality of read accesses and a plurality of write accesses can independently and concurrently be made through these ports.

2) Description of the Related Art

Figure 7:
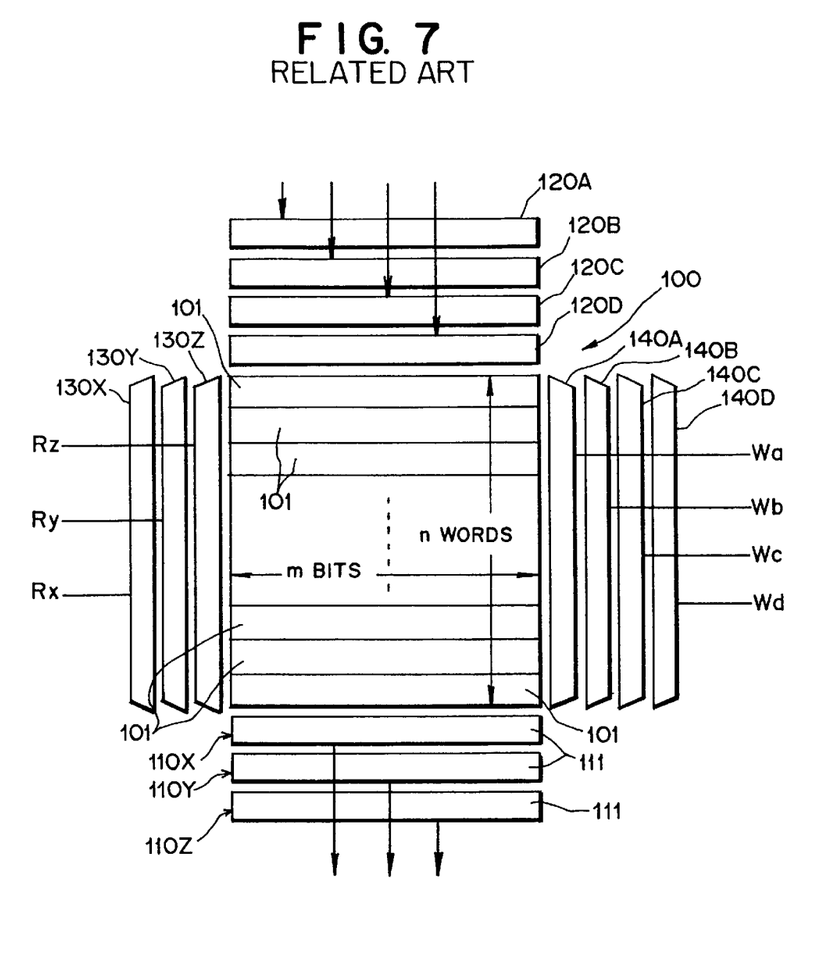
FIG. 7 is a block diagram showing a register file with a typical multiport configuration.

As shown in FIG. 7, a register file 100 with a typical multiport configuration includes register arrays 101 forming a word width n (the number of words: for example, n=32, 64, 128, . . . ), and a word having a bit width m (the number of bits: for example, m=16, 32, . . . ) can be stored in each of the register arrays 101. That is, a main body (register portion) of the register file 100 includes cell arrays arranged in an m by n rectangle.

Further, the register file 100 has three read ports 110X to 110Z, and four write ports 120A to 120D. Through these ports 110X to 110Z and 120A to 120D, three read accesses and four write accesses can be made independently and concurrently.

The register file 100 includes read decoders 130X to 130Z to respectively decode read addresses Rx to Rz externally input for selections of words to be read from the read ports 110X to 110Z. The read decoders 130X to 130Z respectively put in a read state the register arrays 101 specified according to results of decoding, and send data (words) stored in the register arrays 101 to the read ports 110X to 110Z.

The read ports 110X to 110Z are respectively provided with sense amplifiers 111. Signals read from the register arrays 101 are sent to the sense amplifiers 111 through unillustrated bit lines (data lines). Subsequently, the signals are amplified by the sense amplifiers 111 up to a level at which digital signal processing can be performed.

In addition, the register file 100 includes write decoders 140A to 140D to respectively decode write addresses Wa to Wd externally input to specify on which of the register arrays 101 the data input from the write ports 120A to 120D should be written. The write decoders 140A to 140D respectively put in a write state the register arrays 101 specified according to results of decoding, and the data from the write ports 120A to 120D are stored in the register arrays 101.

Meanwhile, from year to year, higher performance has increasingly been desired in a processor such as microprocessor with the register file incorporated therein. Thus, an operating frequency is made higher and an amount of handled data is increased steadily, thereby increasing the capacity of the register file.

However, in the register file 100 having the configuration as shown in FIG. 7, when the number of register arrays 101 is increased up to, for example, 1,028 (1,028 words) so as to increase the amount of handled data, there is a problem in that a delay is caused at a time of read access due to loads on the bit lines extending from the register arrays 101 to the read ports 110X to 110Z.

That is, no delay is caused in the register arrays 101 positioned in the vicinity of the sense amplifiers 111 in the read ports 110X to 110Z. On the other hand, considerably long physical distances (the lengths of bit lines) are required between the register arrays 101 positioned on the side of the write ports 120A to 120D in FIG. 7 and the sense amplifiers 111.

Hence, it takes a long time to send signals stored in the register arrays 101 at extremely low levels to the sense amplifiers 111 through the bit lines, and amplify the signals by the sense amplifiers 111, thereafter sending the signals to, for example, flip-flops in the next stage. As a result, the delay may cause a reduction in performance of the whole logic unit.

Figure 8:
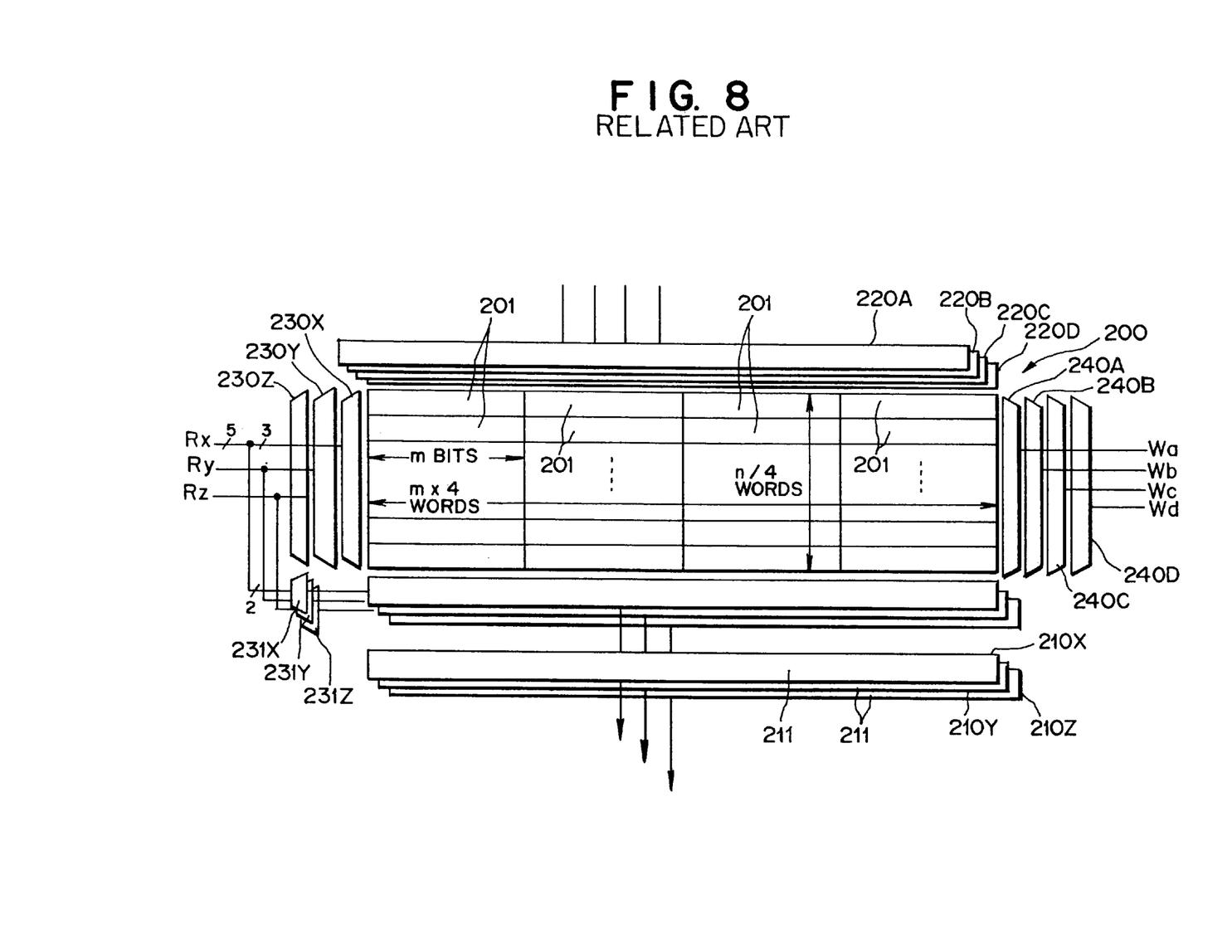
FIG. 8 is a block diagram showing a configuration of a register file employing a column-row read/write system.

In view of the facts, as shown in FIG. 8, a register file 200 employing a column-row read/write system may be used.

As in the register file 100 shown in FIG. 7, the register file 200 shown in FIG. 8 has n register arrays 201 with a bit width m. However, in the register file 200, the four register arrays 201 are aligned horizontally (in a lateral direction of FIG. 8), thereby reducing a word width of the register file 200 to a quarter (n/4) of the word width of the register file 100. A main body (register portion) of the register file 200 includes cell arrays arranged in an (m by 4) by (n/4) rectangle. That is, the register file 200 is laterally divided into the four columns with the bit width m, and is divided into n/4 rows longitudinally (in a longitudinal direction of FIG. 8).

Further, the register file 200 has three read ports 210X to 210Z, and four write ports 220A to 220D. Through these ports 210X to 210Z and 220A to 220D, three read accesses and four write accesses can be made independently and concurrently.

The register file 200 includes row decoders 230X to 230Z and column decoders 231X to 231Z to respectively decode read addresses Rx to Rz (which are, for example, 5-bit address information for n=32) externally input for selections of words to be read from the read ports 210X to 210Z, and includes 4 to 1 multiplexers 232X to 232Z.

Each of the row decoders 230X to 230Z selects one specific row from among the n/4 rows depending upon high order bits (for example, three high order bits) in each of the read addresses Rx to Rz, and puts in a read state four register arrays 201 in the row, thereby sending data (words) stored in the register arrays 201 to each of the 4 to 1 multiplexers 232X to 232Z.

Each of the column decoders 231X to 231Z selects one specific column from among the four columns depending upon low order bits (for example, two low order bits) in each of the read addresses Rx to Rz, thereby sending 4-bit column indicating information to each of the 4 to 1 multiplexers 232X to 232Z.

The 4 to 1 multiplexers 232X to 232Z respectively free column portions corresponding to the column indicating information from the column decoders 231X to 231Z, and send data from the columns to the read ports 210X to 210Z.

The read ports 210X to 210Z are respectively provided with sense amplifiers 211 identical with those in the above discussion. Signals read from the register arrays 201 are sent to the sense amplifiers 211 through unillustrated bit lines (data lines). Subsequently, the signals are amplified by the sense amplifiers 211 up to a level at which digital signal processing can be performed.

In addition, the register file 200 includes write decoders 240A to 240D to respectively decode write addresses Wa to Wd externally input to specify on which of the register arrays 201 the data input from the write ports 220A to 220D should be written. The write decoders 240A to 240D respectively put in a write state the register arrays 201 specified according to results of decoding (the register array 201 positioned in a predetermined column and a predetermined row), and the data from the write ports 220A to 220D are stored in the register arrays 201.

In the above register file 200, it is possible to reduce physical distance from the register array 201 to the sense amplifier 211 to, at the longest, a quarter of the longest distance in the register file 100 shown in FIG. 7. When the register file 200 includes the register arrays 201 to have a capacity of, for example, 1,028 words, the register file 200 has the word width of 256 words, and the physical distance from each of the register arrays 201 to the sense amplifier 211 corresponds to the 256 words at the longest.

Therefore, even when the number of register arrays 201 is increased to increase an amount of handled data, in the register file 200, it is possible to overcome the above problem in that the delay is caused due to the loads on the bit lines at the time of read access.

However, in the register file 200 shown in FIG. 8, though the word width can be reduced to a quarter, the bit width increases fourfold.

In recent years, in a high-performance microprocessor, a data bus width (the number of bits corresponding to a single word) has increasingly been expanded (to, for example, 64 bits or 128 bits) as part of performance improvement. The expansion extremely increases the bit width (to, for example, 256 bits or 1,024 bits) in the register file 200 shown in FIG. 8, thereby providing longer decode lines extending from the decoders 230X to 230Z to the cell arrays. Thus, there is a problem in that the long decode lines cause a delay, resulting in a reduction in performance.

As stated above, the sense amplifier 111 is not always mounted for each of the read ports 110X to 110Z in the register file 100 shown in FIG. 7. Hence, when the word width is expanded, the delay due to the loads on the bit lines causes the reduction in performance. On the other hand, in the register file 200 shown in FIG. 8, though the delay due to the loads on the bit lines can be overcome, the delay due to the long decode lines causes the reduction in performance. In either case, the bit line or the decode line must be made longer with increase in the number of words, resulting in a longer delay time. Consequently, it becomes increasingly difficult to realize rapid access.

Further, for the read addresses Rx to Rz including, for example, 5-bit data in the register file 100 shown in FIG. 7, in most packaging, each of the read decoders 130X to 130Z has a two-stage configuration including a three-input NAND gate and a two-input NAND gate, and a NOR gate receiving outputs of the two NAND gates. Naturally, as the number of bits of the read addresses Rx to Rz is more increased, each of the read decoders 130X to 130Z requires a greater number of gate stages.

However, with increase in the number of stages of the gates forming each of the read decoders 130X to 130Z, the read decoders 130X to 130Z have a larger size, and a longer time is required for decoding at a time of data readout, thereby causing the reduction in performance. Therefore, it has been desired to reduce the number of gate stages in the read decoders 130X to 130Z so as to realize more rapid decoding at the time of data readout.

SUMMARY OF THE INVENTION

In view of the foregoing problems, it is an object of the present invention to provide a register file in which a read access time is reduced and a data bus width is made expandable by reducing an effect of a delay due to a load on a bit line with increase in the number of words, and the number of gate stages in a reading decoder can be reduced, thereby realizing more rapid decoding at a time of data readout and more enhanced performance of a whole logic unit.

According to the present invention, for achieving the above-mentioned objects, there is provided a register file having a plurality of register arrays, and having a multiport configuration in which a read port and a write port are mounted, and a plurality of read accesses and a plurality of write accesses can independently and concurrently be made through the ports. In the register file, the plurality of register arrays are classified into a plurality of banks every predetermined number of words, and the banks are respectively provided with a sense amplifier. Further, the register file includes an in-bank word selecting decoder to decode partial bits of an address for specifying a word to be read, and select a word corresponding to a result of decoding so as to read the word from the register array in each of the banks, a bank selecting decoder to decode remaining bits of the address so as to specify the bank corresponding to a result of decoding, and a multiplexer to take the word selected by the in-bank word selecting decoder and amplified by the sense amplifier from each of the plurality of banks, and select a word from the bank specified by the bank selecting decoder from among the words input by the number of banks so as to output the word to the read port.

As set forth above, the sense amplifier is provided for each of the banks. It is thereby possible to reduce the length of a bit line extending from each of the register arrays to the sense amplifier even when the number of words is increased, and reduce an effect of a delay due to a load on the bit line with increase in the number of words. Further, even when a bit width (data bus width) is expanded, it is possible to reduce an effect of a delay time due to an extension of a decode line. In addition, reading decoders include two types: the in-bank word selecting decoder, and the bank selecting decoder. It is thereby possible to decrease the number of gate stages and the number of gates in the decoders.

Moreover, the in-bank word selecting decoder may be shared among the plurality of banks. It is thereby possible to reduce the number of gates.

In this case, a first inverter may be mounted to invert/amplify a signal from the in-bank word selecting decoder, and a second inverter may be mounted for each of the banks to invert/amplify a signal from the first inverter, and place the signal on a decode line. It is thereby possible to surely amplify the signal sent from the in-bank word selecting decoder to the decode line of each of the banks while minimizing increases in the number of gate stages and the number of gates.

Further, there may be mounted a bypass line through which a word input from the write port is directly output to the read port, and the multiplexer may have the function as a bypass selecting circuit to select the word through the bypass line and output the word to the read port. In this case, a bypass control circuit is mounted to cause the multiplexer to function as the bypass selecting circuit when a read address matches a write address.

By using the multiplexer as the bypass selecting circuit as described above, when, for example, parallel arithmetic processing is performed in a pipeline system, it is possible to write one result onto a predetermined register array as a word, and concurrently and immediately use the word as an operand for another arithmetic processing.

As set forth above, according to the register file of the present invention, it is possible to provide the following effects or advantages:

1) It is possible to reduce the length of the bit line extending from each of the register arrays to the sense amplifier even when the number of words is increased. Consequently, it is possible to reduce the effect of the delay due to the load on the bit line with increase in the number of words so as to considerably reduce a read access time. Further, even when the bit width is expanded, the delay time due to the extension of the decode line exerts no serious effect on the register file. Therefore, it is possible to ensure performance of the register file even when the data bus width is expanded. In addition, it is possible to decrease the number of gate stages and the number of gates in the reading decoders, thereby realizing more rapid decoding at the time of data readout. As a result, the whole logic unit significantly increases in performance.

2) The in-bank word selecting decoder is shared among the plurality of banks. It is thereby possible to significantly reduce the number of gates so as to provide a more simplified and smaller reading decoder, reduce power consumption by the reading decoder, and realize more rapid decoding at the time of data readout. In this case, the first inverter is mounted on the side of output of the in-bank word selecting decoder, and the second inverter is mounted on the side of input of the decode line of each bank. It is thereby possible to surely amplify the signal sent from the in-bank word selecting decoder to the decode line of each of the banks while minimizing increases in the number of gate stages and the number of gates. Further, buffering using the inverters can realize load distribution, thereby reducing the read access time.

3) The multiplexer can also serve as the bypass selecting circuit. It is thereby possible to reduce a scale of a circuit forming the arithmetic and logic unit so as to reduce the number of logic gate stages, and reduce the read access time.

DESCRIPTION OF THE PREFERRED EMBODIMENTS

A description will now be given of embodiments of the present invention referring to the accompanying drawings.

[A] Description of First Embodiment

Figure 1:
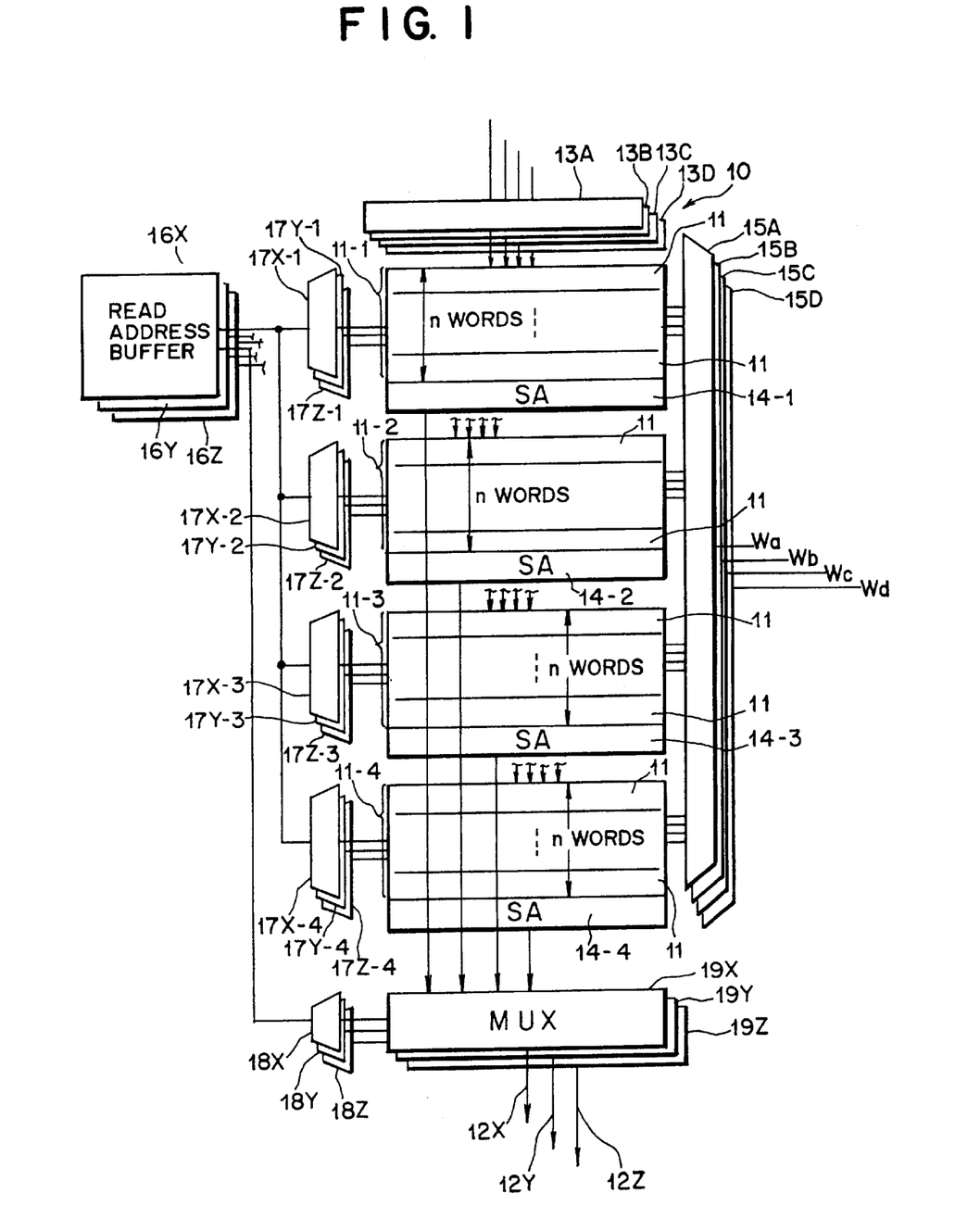
FIG. 1 is a block diagram showing a configuration of a register file according to the first embodiment of the present invention.

FIG. 1 is a block diagram showing a configuration of a register file according to the first embodiment of the present invention. As shown in FIG. 1, a register file 10 of the first embodiment includes (n by 4) register arrays 11 capable of containing a word with a bit width m, and has three read ports 12x to 12Z, and four write ports 13A to 13D. Through the ports 12X to 12Z and 13A to 13D, three read accesses and four write accesses can be made independently and concurrently.

In the embodiment, the register arrays 11 are classified into four banks 11-1 to 11-4 every n (predetermined number) words. The banks 11-1 to 11-4 are independently provided with sense amplifiers (SAs, read amplifiers) 14-1 to 14-4. That is, each of the banks 11-1 to 11-4 includes cell arrays arranged in an m by n rectangle. A signal is read from the register array 11 in each of the banks 11-1 to 11-4, and is sent to the sense amplifier 11 through an unillustrated bit line (data line). The signal is amplified by the sense amplifier 11 up to a level at which digital signal processing can be performed.

The register file 10 includes writing decoders 15A to 15D to respectively decode write addresses Wa to Wd externally input for specifying on which of the register arrays 11 the data input from the write ports 13A to 13D should be written. The writing decoders 15A to 15D respectively put in a write state the register arrays 11 specified according to results of decoding, and the data from the write ports 13A to 13D are stored in the register arrays 11.

Further, the register file 10 of the embodiment includes read address buffers 16X, 16Y, and 16Z, in-bank word selecting decoders 17X-1 to 17X-4, 17Y-1 to 17Y-4, and 17Z-1 to 17Z-4, bank selecting decoders 18X, 18Y, and 18Z, and multiplexers (MUXs) 19X, 19Y, and 19Z, all of which respectively correspond to the read ports 12X to 12z.

Meanwhile, in the embodiment, reference numerals including "X, " "Y, " and "Z" denote component parts respectively mounted corresponding to the read ports 12X, 12Y, and 12Z, and reference numerals including "-1," "-2," "-3," and "-4" are component parts respectively mounted corresponding to the banks 11-1, 11-2, 11-3, and 11-4.

The read address buffers 16X, 16Y, and 16Z respectively hold read addresses Rx, Ry, and Rz externally input for selection of words to be read from the read ports 12X to 12Z.

The in-bank word selecting decoders 17X-1 to 17X-4, 17Y-1 to 17Y-4, and 17Z-1 to 17Z-4, and the bank selecting decoders 18X to 18Z respectively function as reading decoders to decode the read addresses Rx to Rz held in the buffers 16X to 16Z.

The in-bank word selecting decoders 17X-1 to 17X-4, 17Y-1 to 17Y-4, and 17Z-1 to 17Z-4 respectively decode high order bits of the read addresses held in the buffers 16X to 16Z, and select words corresponding to results of decoding so as to read the words from the register arrays 11 in the banks 11-1 to 11-4.

The bank selecting decoders 18X to 18Z respectively decode low order bits of the read addresses held in the buffers 16X to 16Z, and select specific banks corresponding to results of decoding from among the banks 11-1 to 11-4.

Further, each of the multiplexers 19X to 19Z receives, from the four banks 11-1 to 11-4, four words selected by each of the in-bank word selecting decoders 18X to 18Z and amplified by each of the sense amplifiers 14-1 to 14-4, and selects from among the four words one word from the bank specified by each of the bank selecting decoders 18X to 18Z so as to output the one word to each of the read ports 12X to 12Z.

Moreover, two address buses extend from the buffer 16X, that is, the address bus on the side of high order bits is connected to the in-bank word selecting decoders 17X-1 to 17X-4, and the address bus on the side of low order bits is connected to the bank selecting decoder 18X. FIG. 1 does not show bus connections between the buffer 16Y and the in-bank word selecting decoders 17Y-1 to 17Y-4, and between the buffer 16Y and the bank selecting decoder 18Y, and bus connections between the buffer 16Z and the in-bank word selecting decoders 17Z-1 to 17Z-4, and between the buffer 16Z and the bank selecting decoder 18Z. However, the connections are established as in those shown in FIG. 1 between the buffer 16X and the in-bank word selecting decoders 17X-1 to 17X-4, and between the buffer 16X and the bank selecting decoder 18x.

In the above configuration of the register file 10 according to the first embodiment of the present invention, data input from the write ports 13A to 13D are respectively written by the writing decoders 15A to 15D onto any one of the (n by 4) register arrays 11 according to the write addresses Wa to Wd.

On the other hand, in order to read from, for example, the read port 12X a word (data) written onto the one register array 11 in the register file 10, the read address Rx for specifying the word is set in the buffer 16X.

High order bits of the read address Rx are input into the in-bank word selecting decoders 17X-1 to 17X-4 to be respectively decoded in the decoders 17X-1 to 17X-4. Subsequently, words corresponding to results of decoding are selected to be read from the register arrays 11 in the banks 11-1 to 11-4.

The read words (signals) are amplified by the sense amplifiers 14-1 to 14-4 for the banks 11-1 to 11-4 up to a level at which digital signal processing can be performed, and are output to the multiplexer 19x.

This reduces bit lines (not shown) extending from the register arrays 11 to the sense amplifiers 14-1 to 14-4 greater than would be in the case where the sense amplifier is provided for each read port as shown in FIG. 7, thereby reducing an effect of a delay due to loads on the bit lines. In this case, though long lines extend from the sense amplifiers 14-1 to 14-4 to the multiplexers 19X to 19Z, signals on the lines are amplified by the sense amplifiers 14-1 to 14-4 to the predetermined level so that effects of delay and noise due to the lengths of the lines can be almost negligible.

Further, low order bits of the read address Rx are input into the bank selecting decoder 18X to be decoded in the decoder 18X, and a specific bank corresponding to a result of decoding is selected from among the banks 11-1 to 11-4. Subsequently, a word from the bank specified by the bank selecting decoders 18X to 18Z is selected by the multiplexer 19X from among the four words from the banks 11-1 to 11-4, and is output to the read port 12X.

In the embodiment, as set forth above, the two address buses extend for the high order bits and the low order bits. For example, the high order bits may be used for the in-bank word selection to read the data for each bank, and the low order bits may be used to obtain desired data output from among the data input by the number of banks. It is thereby possible to reduce the number of gate stages in the reading decoder, and reduce a decode time.

More specifically, when the read addresses Rx to Rz are, for example, 5-bit data, three high order bits may be used for the in-bank word selection, and two low order bits may be used for the bank selection. In such a case, the in-bank word selecting decoders 17X-1 to 17X-4, 17Y-1 to 17Y-4, and 17Z-1 to 17Z-4 respectively have a single-stage configuration including a three-input gate, and the bank selecting decoders 18X to 18Z respectively have a single-stage configuration including a two-input gate. Thus, it is possible to reduce the number of gate stages to the number obtained by subtracting one from the number of gates in the illustration of FIG. 7, and reduce the number of gates, thereby realizing more rapid decoding.

Though the description has been given of only a case where the data is read from the read port 12X, data readout from the read ports 12Y, 12Z are performed as in the above discussion.

As stated above, according to the register file 10 serving as the first embodiment of the present invention, the banks 11-1 to 11-4 are independently provided with the sense amplifiers 14-1 to 14-4. It is thereby possible to reduce the lengths of the bit lines extending from the register arrays 11 to the sense amplifiers 14-1 to 14-4 even when the number of words is increased. Consequently, it is possible to reduce the effect of the delay due to the loads on the bit lines with increase in the number of words so as to considerably reduce a read access time.

Further, unlike the register file 200 shown in FIG. 8, even when the bit width (data bus width) is expanded, the delay time due to the extended decode lines exerts no serious effect on the register file 10. Therefore, it is possible to ensure performance of the register file 10 even when the data bus width is expanded.

In addition, the two address buses are provided, and the reading decoders include two types: the in-bank word selecting decoders 17X-1 to 17X-4, 17Y-1 to 17Y-4, and 17Z-1 to 17Z-4, and the bank selecting decoders 18X to 18Z. It is thereby possible to decrease the number of gate stages and the number of gates in the reading decoder, thereby realizing more rapid decoding at the time of data readout.

As a result, the whole logic unit significantly increases in performance.

[B] Description of Second Embodiment

Figure 2:
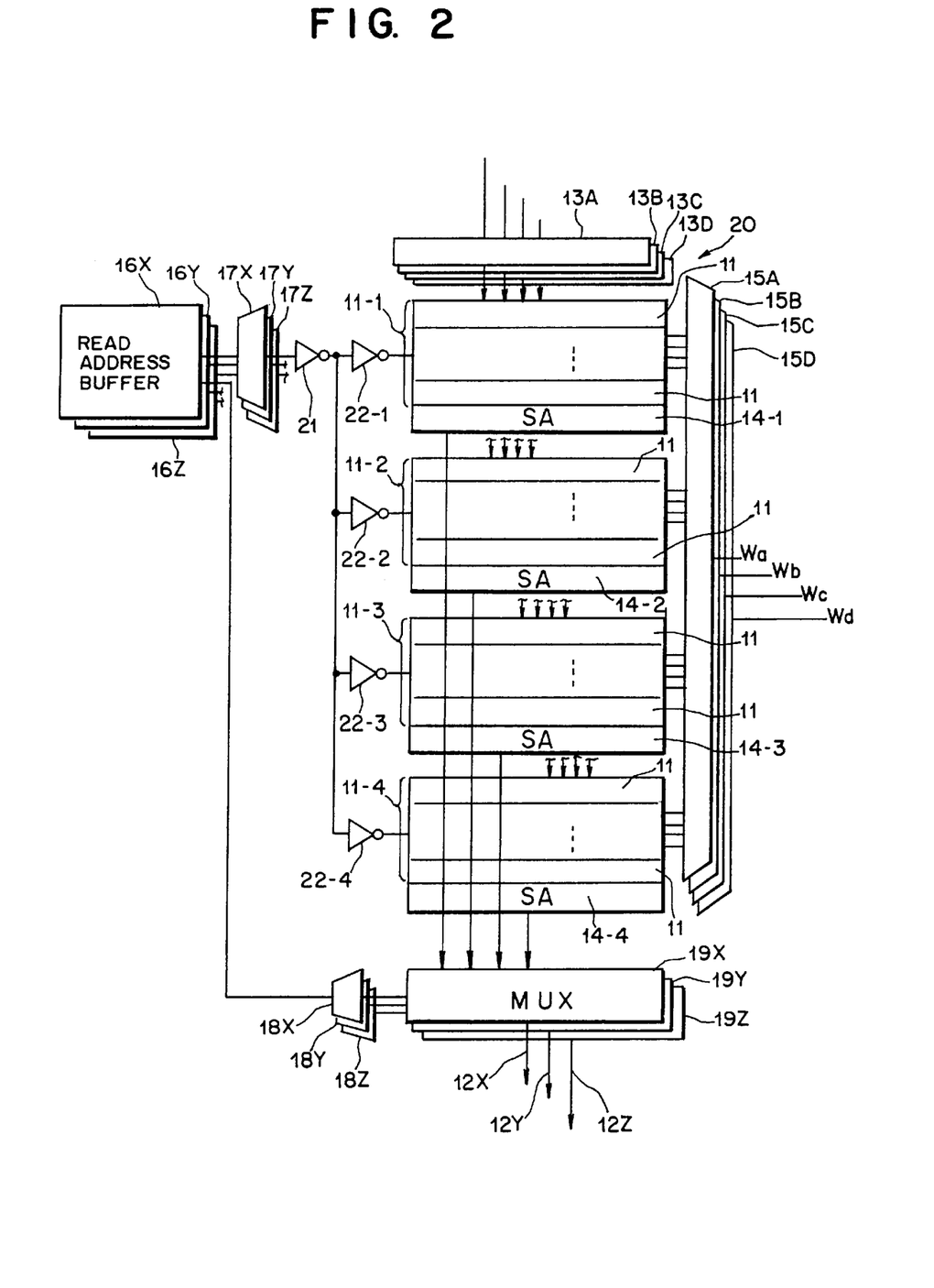
FIG. 2 is a block diagram showing a configuration of a register file according to the second embodiment of the present invention.

FIG. 2 is a block diagram showing a configuration of a register file according to the second embodiment of the present invention. As shown in FIG. 2, a register file 20 of the second embodiment is configured substantially as in the register file 10 of the first embodiment. In FIG. 2, the same reference numerals are used for component parts identical with or equivalent to those in the above discussion, and descriptions thereof are omitted.

In the register file 10 of the first embodiment, the in-bank word selecting decoders 17X-1 to 17X-4, 17Y-1 to 17Y-4, and 17Z-1 to 17Z-4 are mounted for the read ports and for the banks. Against this, in the register file 20 of the second embodiment, corresponding to read ports 12X, 12Y, and 12Z, in-bank word selecting decoders 17X, 17Y, and 17Z are mounted to have the same functions as those of the in-bank word selecting decoders in the first embodiment. Further, the decoders 17X to 17Z are respectively shared among four banks 11-1 to 11-4. In the register file 20 of the second embodiment, it is thereby possible to additionally reduce the number of gates in reading decoders.

In order to share the decoders 17X to 17Z among the four banks 11-1 to 11-4, it is necessary to send results of decoding (word selecting signals) in the decoders 17X to 17Z to the banks 11-1 to 11-4 disposed widely. For this purpose, in the embodiment, a first inverter 21 and second inverters 22-1 to 22-4 are mounted to have the function of amplification between the decoders 17X to 17Z and the four banks 11-1 to 11-4. Though FIG. 2 shows only the inverters 21 and 22-1 to 22-4 between the decoder 17X and the four banks 11-1 to 11-4, additional inverters 21 and 22-1 to 22-4 are similarly mounted between the decoder 17Y and the four banks 11-1 to 11-4, and between the decoder 17Z and the banks 11-1 to 11-4.

The first inverter 21 inverts/amplifies a signal from the decoder 17X (17Y, 17Z), and the second inverters 22-1 to 22-4 respectively invert/amplify a signal from the first inverter 21 to place a result on decode lines of the banks 11-1 to 11-4.

In general, the inverters are paired to form a buffer for amplification. However, as shown in FIG. 2, the inverter 21 in a first stage is shared, and the inverters 22-1 to 22-4 in a second stage are mounted for each bank. It is thereby possible to surely amplify the signals sent from the in-bank word selecting decoders 17X to 17Z to the decode lines of the banks 11-1 to 11-4 while minimizing increases in the number of gate stages and the number of gates.

In the above configuration of the register file 20 according to the second embodiment, data can be written/read as in the register file 10 of the first embodiment. However, at a time of data readout, high order bits of read addresses Rx to Rz are respectively input into the in-bank word selecting decoders 17X to 17Z to be decoded in the decoders 17X to 17Z. Subsequently, results of decoding are amplified by the first inverters 21 and the second inverters 22-1 to 22-4 to be place on the decode lines of the banks 11-1 to 11-4. Finally, words corresponding to the results of decoding are selected and read from register arrays 11 in the banks 11-1 to 11-4.

As set forth above, according to the register file 20 serving as the second embodiment of the present invention, it is possible to provide the same effects as those in the register file 10 of the first embodiment described above. In addition, since the in-bank word selecting decoders 17X to 17Z are shared among the four banks 11-1 to 11-4, it is possible to significantly reduce the number of gates so as to provide a more simplified and smaller reading decoder, reduce power consumption by the reading decoder, and realize more rapid decoding at the time of data readout.

In this case, the first inverters 21 and the second inverters 22-1 to 22-4 enable sure amplification of the signals sent from the in-bank word selecting decoders 17X to 17Z to the decode lines of the banks 11-1 to 11-4 while minimizing an increase in the number of gate stages. Buffering using the inverters 21 and 22-1 to 22-4 can realize load distribution, thereby reducing a read access time.

[C] Description of Third Embodiment

Figure 3:
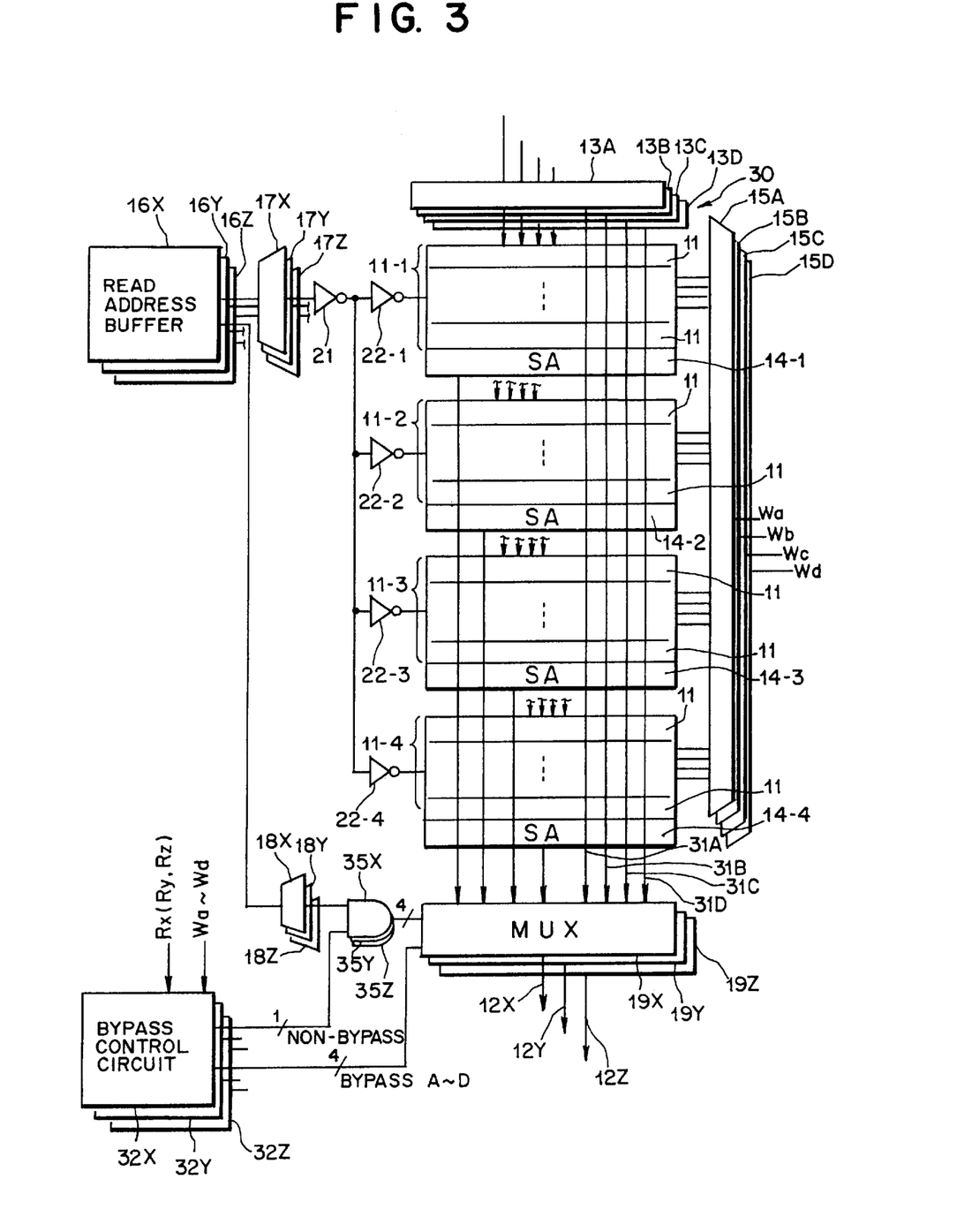
FIG. 3 is a block diagram showing a configuration of a register file according to the third embodiment of the present invention.

FIG. 3 is a block diagram showing a configuration of a register file according to the third embodiment of the present invention. As shown in FIG. 3, a register file 30 of the third embodiment is configured substantially as in the register file 20 of the second embodiment. In FIG. 3, the same reference numerals are used for component parts identical with or equivalent to those in the above discussion, and descriptions thereof are omitted.

In the register file 30 of the third embodiment, bypass lines 31A to 31D extend between write ports 13A to 13D and each of multiplexers 19X to 19Z such that words input from the four write ports 13A to 13D can directly be output therethrough to read ports 12X to 12Z.

Besides, each of the multiplexers 19X to 19Z in the third embodiment serves as a bypass selecting circuit to select the word input through any one of the four bypass lines 31A to 31D so as to output a result to each of the read ports 12X to 12Z. A configuration of each multiplexer will specifically be described later referring to FIG. 5.

Further, the register file 30 includes bypass control circuits 32X to 32Z to cause the multiplexers 19X to 19Z to function as a bypass selecting circuit when any one of read addresses Rx to Rz matches any one of write addresses Wa to Wd.

Figure 4:
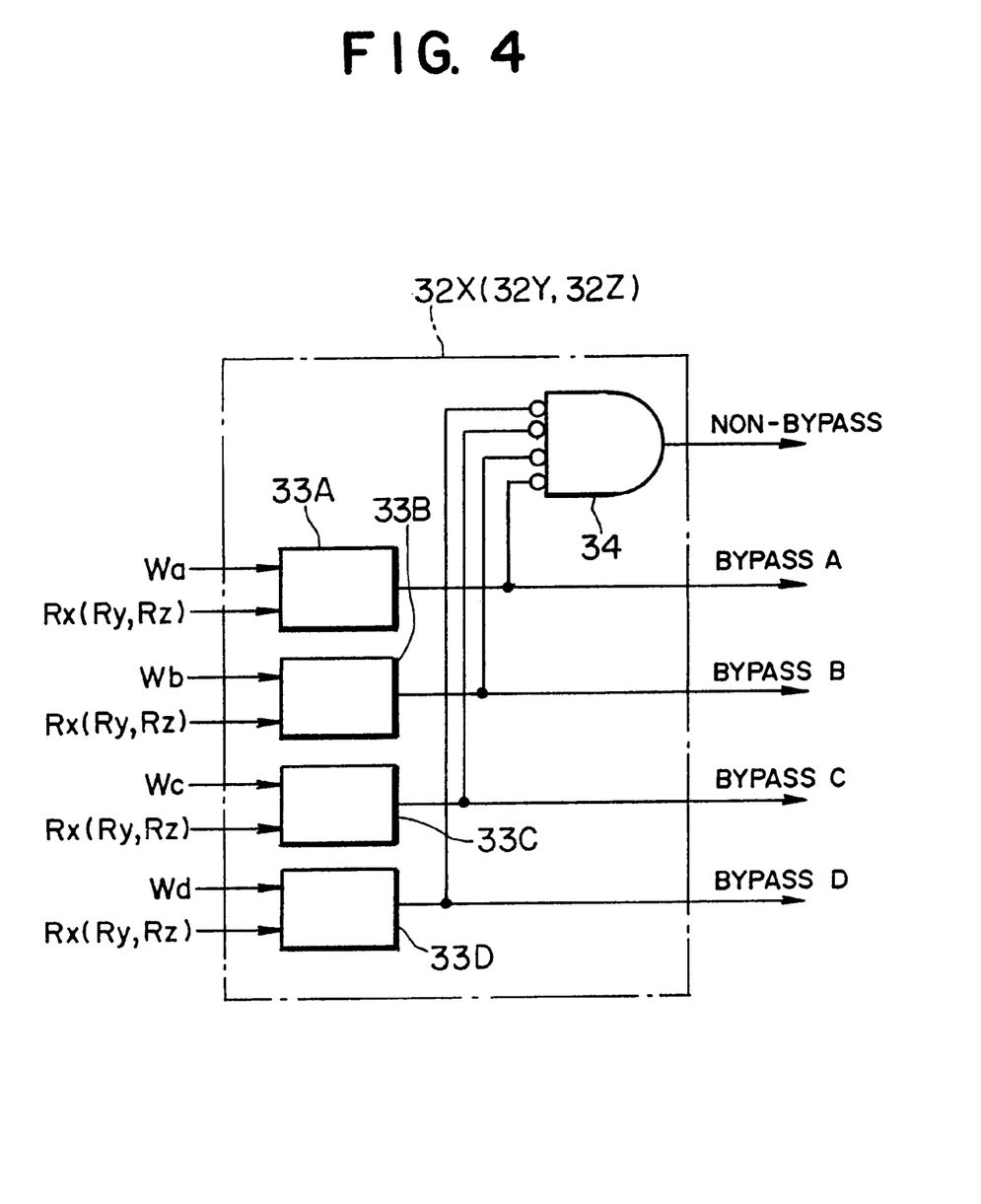
FIG. 4 is a block diagram showing a configuration of a bypass controller in the third embodiment.

A description will now be given of a specific configuration of the bypass control circuit 32X with reference to FIG. 4. As shown in FIG. 4, the bypass control circuit 32X includes four comparators 33A, 33B, 33C, and 33D, and an AND gate with NOT input terminal 34.

The four comparators 33A, 33B, 33C, and 33D respectively compare the read address Rx with the four write addresses Wa to Wd, and output signals "BYPASS A" to "BYPASS D" which rise from "0" to "1" if a match has occurred.

Further, the AND gate with NOT input terminal 34 receives the four signals "BYPASS A" to "BYPASS D" from the comparators 33A to 33D for inversion through a NOT input terminal, and outputs the conjunction of the inverted signals as a signal "NON-BYPASS."

Moreover, the bypass control circuits 32Y, 32Z are configured as in the bypass control circuit 32X except that read addresses Ry, Rz are respectively compared with the four write addresses Wa to Wd.

On the other hand, as shown in FIG. 3, in the register file 30, AND gates 35X, 35Y, and 35Z are respectively interposed between bank selecting decoders 18X to 18Z and the multiplexers 19X to 19Z. The AND gates 35X to 35Z respectively output the conjunctions between results of decoding from the bank selecting decoders 18X to 18Z and the signals "NON-BYPASS" from the bypass control circuits 32X to 32Z, as bank selecting signals (4-bit signals in the discussion), to the multiplexers 19X to 19Z.

Figure 5:
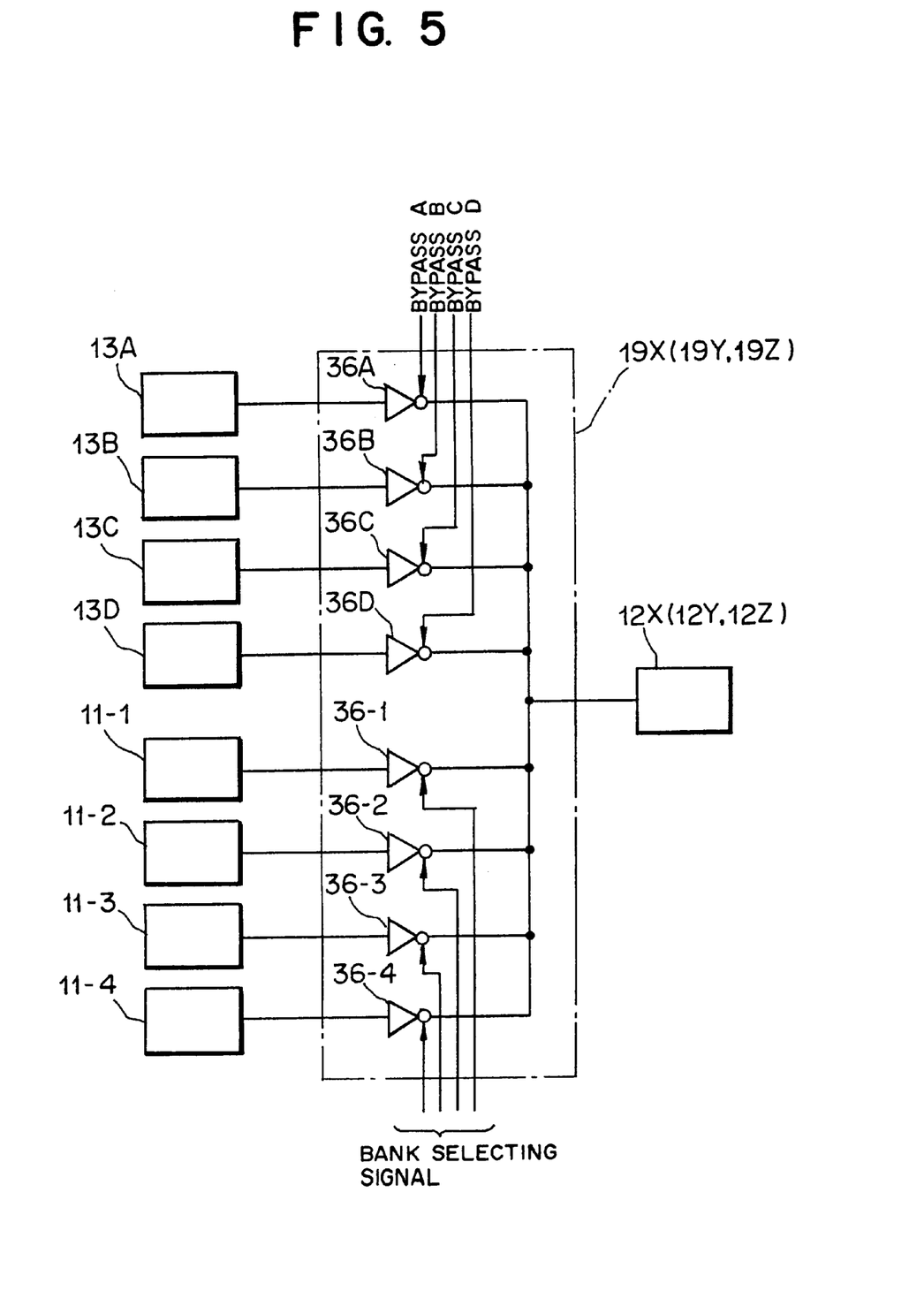
FIG. 5 is a block diagram showing a configuration of a multiplexer in the third embodiment.

Further, as shown in FIG. 5, each of the multiplexers 19X to 19Z of the third embodiment includes eight switching elements 36A, 36B, 36C, 36D, 36-1, 36-2, 36-3, and 36-4.

Input terminals of the switching elements 36A to 36D are respectively connected to the write ports 13A to 13D through the bypass lines 31A to 31D, and input terminals of the switching elements 36-1 to 36-4 are respectively connected to banks 11-1 to 11-4 (sense amplifiers 14-1 to 14-4).

Further, output terminals of the switching elements 36A to 36D and 36-1 to 36-4 are wired OR and connected to the read port 12X (12Y, 12Z).

The switching elements 36A to 36D are respectively opened when the signals "BYPASS A" to "BYPASS D" rise, thereby directly outputting the words input into the write ports 13A to 13D to the read port 12X (12Y, 12Z). When the bank selecting signal rises, the switching elements 36-1 to 36-4 are respectively opened to output words read from the bank 11-1 to 11-4 to the read port 12X (12Y, 12Z).

In the above configuration of the register file 30 of the third embodiment, data can be written/read as in the register file 20 of the second embodiment.

However, at a time of normal readout (no bypassing being required), all the signals "BYPASS A" to "BYPASS D" are set to "0s" in the bypass selecting circuits 32X to 32Z, and the signal "NON-BYPASS" from the AND gate 34 is set to "1." Therefore, results of decoding in the bank selecting decoders 18X to 18Z respectively pass through the AND gates 35X to 35Z, and are input as the bank selecting signals into the multiplexers 19X to 19Z. Subsequently, in each of the multiplexers 19X to 19Z, any one of the switching elements 36-1 to 36-4 is opened to select a word from the bank specified by each of the bank selecting decoders 18X to 18Z from among the four words from the banks 11-1 to 11-4, and output a result to the read port 12X.

Figure 6:
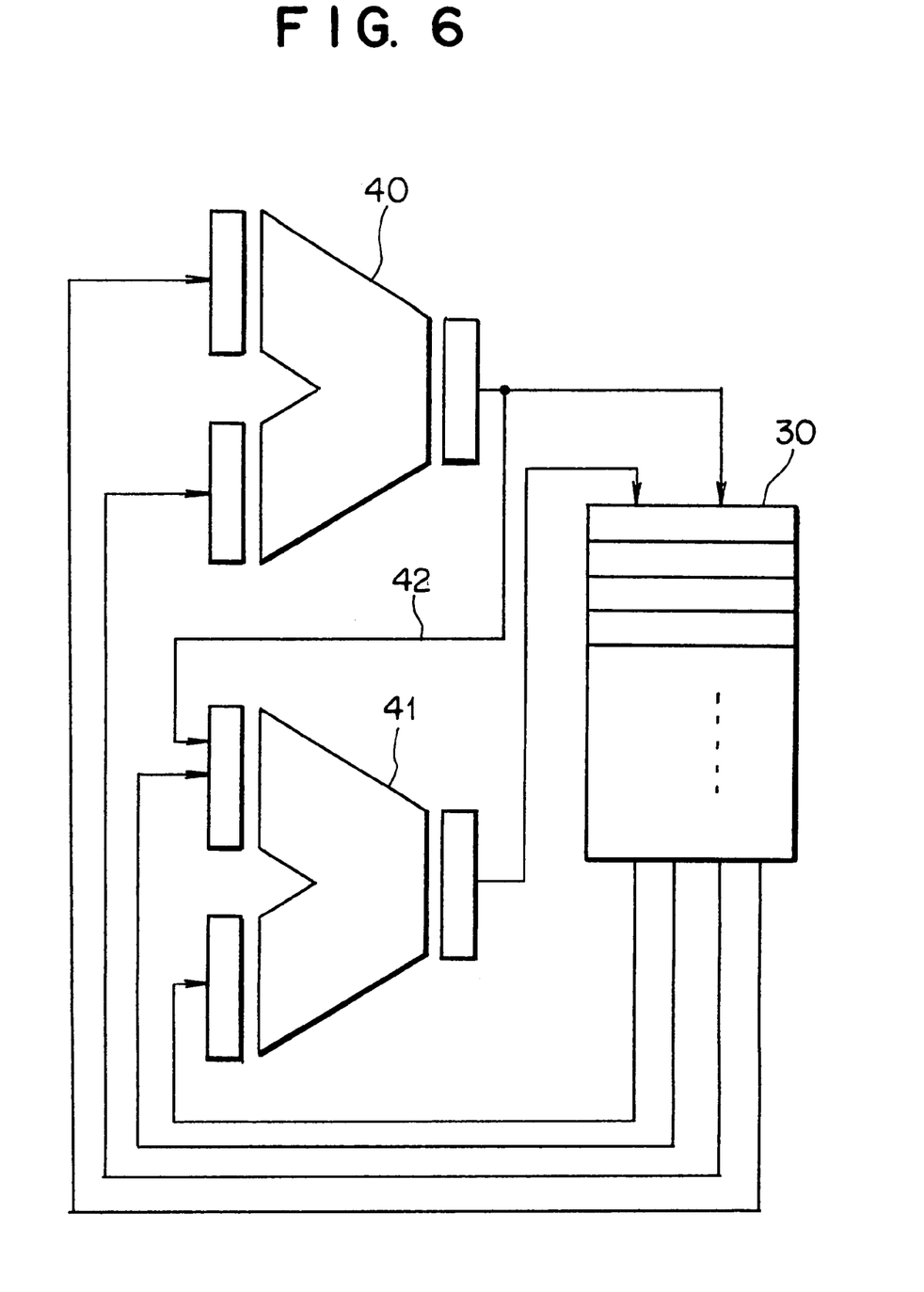
FIG. 6 is a diagram showing a configuration of a pipeline system including arithmetic and logic units so as to explain the necessity of bypassing the register file.

Meanwhile, a description will be given of a case where the register file 30 is mounted together with, for example, two arithmetic and logic units (ALUs) 40, 41 as shown in FIG. 6 in a pipeline system for parallel arithmetic processing. In the system shown in FIG. 6, results of operation in the arithmetic and logic units 40, 41 are written onto the register file 30, and operands used for operations in the arithmetic and logic units 40, 41 are read from the register file 30.

It is assumed that the arithmetic and logic unit 40 performs an operation: A+B=C, and the arithmetic and logic unit 41 performs an operation: C+D=E. In this case, in order to improve an operation efficiency, it is necessary to feed the operand C to the arithmetic and logic unit 41 as soon as possible. After the result C of operation in the arithmetic and logic unit 40 is temporarily written onto the register file 30, the result C may be read from the register file 30 into the arithmetic and logic unit 41. However, this causes a waiting time in the arithmetic and logic unit 41, resulting in a lower operation speed. Hence, it is desired that the result C of operation in the arithmetic and logic unit 40 can be written onto the register file 30 and can concurrently be sent as the operand to the arithmetic and logic unit 41 through the bypass line 42 as shown in FIG. 6.

In the register file 30 of the third embodiment, when the above bypassing is required for the register file 30, any one of the read addresses Rx to Rz matches any one of the write addresses Wa to Wd. Consequently, in the bypass control circuits 32X to 32Z, any one of the signals "BYPASS A" to "BYPASS D" from the comparators 33A to 33D rises to "1."

For example, when the read address Rx matches the write address Wc, the signal "BYPASS C" from the comparator 33C in the bypass control circuit 32X rises to "1." This sets the signal "NON-BYPASS" from the AND gate 34 to "0" so that a result of decoding from the bank selecting decoder 18X can not pass through the AND gate 35X. On the other hand, the signal "BYPASS C" rising to "1" opens the switching element 36C in the multiplexer 19X, and a word input into the write port 13C is directly output from the read port 12X through the bypass line 31C and the switching element 36C.

As stated above, according to the register file 30 serving as the third embodiment of the present invention, it is possible to provide the same effects as those in the register file 10 of the first embodiment and those in the register file 20 of the second embodiment. In addition, when the parallel arithmetic processing is performed in the pipeline system, it is possible to write the result of operation onto the predetermined register array 11 as the word, and concurrently and immediately use the word as the operand for another arithmetic processing. That is, the multiplexers 19X to 19Z can also serve as the bypass selecting circuits. It is thereby possible to reduce a scale of a circuit forming the arithmetic and logic unit so as to reduce the number of logic stages, and reduce a read access time.

[D] Others

The above embodiments have been described with reference to a case where the three read ports 12X to 12Z and the four write ports 13A to 13D are mounted, and the register arrays 11 are classified into the four banks 11-1 to 11-4. However, it is to be noted that the present invention should not be limited to the embodiments, and many modifications and changes may be made without departing from the inventive concept.

What is claimed is:

1. Addressing circuitry for a register file having a plurality of register arrays, and having a multiport configuration in which a read port and a write port are mounted, and a plurality of read accesses and a plurality of write accesses independently and concurrently are made through the ports, wherein the plurality of register arrays are classified into a plurality of banks every predetermined number of words, and the plurality of banks being respectively provided with a sense amplifier, said addressing circuitry comprising:

an in-bank word selecting decoder, directly connected to each one of the plural banks, to decode partial bits of an address for specifying a word to be read, and select a word corresponding to a result of decoding so as to read the word from the register array in each of the banks;

a bank selecting decoder to decode remaining bits of the address so as to specify the bank corresponding to a result of decoding; and a multiplexer to take the word selected by the in-bank selecting decoder and amplified by the sense amplifier from each of the plurality of banks, and select a word from the bank specified by the bank selecting decoder from among the words input by the number of banks so as to output the word to the read port.

2. Addressing circuitry for a register file having a plurality of register arrays, and having a multiport configuration in which a read port and a write port are mounted, and a plurality of read accesses and a plurality of write accesses independently and concurrently are made through the ports, wherein the plurality of register arrays are classified into a plurality of banks every predetermined number of words, and the plurality of banks being respectively provided with a sense amplifier, and said addressing circuitry comprising:

an in-bank word selecting decoder, shared among the plural banks, to decode partial bits of an address for specifying a word to be read, and select a word corresponding to a result of decoding so as to read the word from the register array in each of the banks;

a bank selecting decoder to decode remaining bits of the address so as to specify a bank corresponding to a result of decoding; and a multiplexer to take the word selected by the in-bank selecting decoder and amplified by the sense amplifier from each of the plurality of banks, and select the word from the bank specified by the bank selecting decoder from among the words input by the number of banks so as to output the word to the read port.

3. An addressing circuitry according to claim 2, further comprising:

a first inverter to invert/amplify a signal from the in-bank word selecting decoder; and a second inverter mounted for each of the banks to invert/amplify a signal from the first inverter, and place the signal on a decode line.

4. A register file, comprising a plurality of register arrays having a multiport configuration in which a read port and a write port are mounted and a plurality of read accesses and a plurality of write accesses independently and concurrently are made through the ports, the plurality of register arrays being classified into a plurality of banks every predetermined number of words;

sense amplifiers respectively provided for the plurality of banks;

an in-bank word selecting decoder to decode partial bits of an address specifying a first word to be read, and to select a word corresponding to a result of decoding so as to read the word from the register array in each of the banks;

a bank selecting decoder to decode remaining bits of the address so as to specify a bank corresponding to a result of decoding;

a multiplexer, coupled to the banks and to the bank selecting decoder, to take the word selected by the in-bank selecting decoder and amplified by the sense amplifier from each of the plurality of banks, and to select the first word from the bank specified by the bank selecting decoder from among the words input by the number of banks so as to output the first word to the read port; and a bypass line coupled to the multiplexer and through which a second word input from the write port is directly output to the read port, and the multiplexer also operates to function as a bypass selecting circuit to select the second word through the bypass line and to output the second word to the read port.

5. An addressing circuitry according to claim 2, wherein there is mounted a bypass line through which a word input from the write port is directly output to the read port, and the multiplexer having the function as a bypass selecting circuit to select the word through the bypass line, and output the word to the read port.

6. An addressing circuitry file according to claim 3, wherein there is mounted a bypass line through which a word input from the write port is directly output to the read port, and the multiplexer having the function as a bypass selecting circuit to select the word through the bypass line, and output the word to the read port.

7. A register file according to claim 4, further comprising a bypass control circuit to cause the multiplexer to function as the bypass selecting circuit when a read address matches a write address.

8. An addressing circuitry according to claim 5, further comprising a bypass control circuit to cause the multiplexer to function as the bypass selecting circuit when a read address matches a write address.

9. An addressing circuitry according to claim 6, further comprising a bypass control circuit to cause the multiplexer to function as the bypass selecting circuit when a read address matches a write address.

10. A register file, comprising register arrays having a multiport configuration in which a read port and a write port are mounted and read accesses and write accesses independently and concurrently are made through the ports, the register arrays being classified into banks every predetermined number of words;

sense amplifiers respectively provided for the banks;

an in-bank word selecting decoder, directly connected to each bank, to decode partial bits of an address specifying a word to be read, and to select a word corresponding to a result of decoding so as to read the word from the register array in each of the banks;

a bank selecting decoder to decode remaining bits of the address so as to specify a bank corresponding to a result of decoding; and a multiplexer, coupled to the banks and to the bank selecting decoder, to take the word selected by the in-bank selecting decoder and amplified by the sense amplifier from each bank, and to select a word from the bank specified by the bank selecting decoder from among the words input by the banks and output the word to the read port.

* * * * *